(12) United States Patent
Liu et al.

(10) Patent No.: US 6,198,153 B1
(45) Date of Patent: Mar. 6, 2001

(54) CAPACITORS WITH SILICIZED POLYSILICON SHIELDING IN DIGITAL CMOS PROCESS

(75) Inventors: Edward W. Liu, Sunnyvale; See-Hoi Caesar Wong, Fremont, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 08/840,948

(22) Filed: Apr. 21, 1997

(51) Int. Cl.[7] .......................... H01L 27/108; H01L 29/00
(52) U.S. Cl. .......................... 257/532; 257/296; 257/807
(58) Field of Search ..................... 257/307–308, 257/532, 295–310, 409, 250, 313; 438/250; 361/311–313, 303, 305

(56) References Cited

U.S. PATENT DOCUMENTS

| | | | |
|---|---|---|---|
| 5,104,822 | * 4/1992 | Butler | 438/250 |
| 5,135,883 | * 8/1992 | Bae et al. | 257/308 |
| 5,206,788 | * 4/1993 | Larson et al. | 361/313 |
| 5,220,483 | * 6/1993 | Scott | 361/313 |
| 5,225,704 | * 7/1993 | Wakamiya et al. | 257/409 |
| 5,548,474 | * 8/1996 | Chen et al. | 361/312 |
| 5,576,925 | * 11/1996 | Gorowitz et al. | 361/313 |
| 5,684,315 | * 11/1997 | Uchiyama et al. | 257/295 |
| 5,724,107 | * 3/1998 | Nishikawa et al. | 349/38 |

FOREIGN PATENT DOCUMENTS

| | | | |
|---|---|---|---|
| 402047862 | * 2/1990 | (JP) | 257/532 |

OTHER PUBLICATIONS

IBM Technical Disclosure Bulletin vol. 17, No. 6, Nov. 1974.*

* cited by examiner

Primary Examiner—Minh Loan Tran
Assistant Examiner—Cjong Q Nguyen
(74) Attorney, Agent, or Firm—Mitchell, Silberberg & Knupp LLP

(57) ABSTRACT

The present invention provides for a shielded capacitor in a digital CMOS fabrication process. The shield capacitor comprises a first surface (also known as a top plate) and a second surface (the bottom plate). The bottom plate has two portions which are connected, and the two portions of the bottom plate are positioned to sandwich the top plate in between the portions. A polysilicon layer is fabricated between the plates and the substrate of the semiconductor to isolate the plates from the substrate. To build the shielded capacitor, the polysilicon layer is fabricated first, then the plates are built on top of the polysilicon layer. The polysilicon layer is silicized and is often connected to the ground.

9 Claims, 1 Drawing Sheet

CAPACITORS WITH SILICIZED POLYSILICON SHIELDING IN DIGITAL CMOS PROCESS

BACKGROUND OF THE INVENTION

1. Field of the Invention

The present invention generally relates to the art of manufacturing electrical components. In particular, the present invention relates to the art of fabricating capacitors.

2. Description of Related Art

The conventional method for fabricating capacitors on semiconductors using analog fabrication process technology is relatively simple because the analog fabrication process involves the use of two polysilicon layers. In the analog process, as illustrated by FIG. 1, the capacitors are fabricated using a two polysilicon layers. In FIG. 1, the first layer 12 of polysilicon forms the "Bottom Plate" of the capacitor while the second layer 10 of polysilicon forms the "Top Plate" of the capacitor 8. In addition, because the capacitance per unit area of the polysilicon-polysilicon type of capacitors is relatively large, the physical area required by such capacitors is relatively small.

Fabrication of capacitors on semiconductors is difficult when the digital circuit fabrication process technology is used because the digital process does not utilize multiple polysilicon layers. Therefore, the conventional method of fabricating capacitors for a digital process involves the use of metal layers as the plates of the capacitors. As illustrated by FIG. 2, a conventional capacitor in a digital process comprises a metal top plate 14, sandwiched between two metal bottom plates 16 and 18.

Because the capacitance per unit area of the metal-metal type of capacitors is relatively small, the physical area required by such capacitors is relatively large. In an effort to reduce the physical area occupied by the metal-metal capacitors, the capacitor 20 illustrated by FIG. 2 has the top plate 14 being sandwiched between two bottom plates 16 and 18 which are connected 17 to each other. This structure doubles the surface area between the top plate 14 and the bottom plates 16 and 18 compared to the surface area of capacitors having the more typical structure of one top plate and one bottom plate.

However, even with the use of the sandwich technique, the metal-metal capacitors occupy larger physical areas compared to the polysilicon-polysilicon capacitors of the same capacitance. Due to their larger size, the metal-metal capacitors introduce greater levels of noise to the substrate 22 compared to the polysilicon-polysilicon capacitors, and also are more easily affected by the substrate noise.

SUMMARY OF THE INVENTION

To reduce the noise effects of metal-metal capacitors to and from the substrate, the present invention discloses a three layer metal capacitor structure with a fourth, polysilicon layer, fabricated between the metal plates and the substrate.

The present invention provides for fabricating a capacitor formed on a semiconductor. The capacitor comprises a top plate, a bottom plate, and a shielding layer between said bottom plate and the semiconductor.

The plates of the capacitor may be metal. The bottom plate of the capacitor may comprise a first portion and a second portion, with the two portions sandwiching the top plate. This is done to increase the surface area between the top and the bottom plates. In the preferred embodiment, the plates are made of metal and the shielding layer is made from a polysilicon or silicized polysilicon. The capacitor of the present invention is most useful in Complementary Metal Oxide Semiconductor (CMOS) semiconductor chips.

Also provided by the present invention is a method of fabricating a capacitor in a digital CMOS process. The method is to layer the shielding polysilicon layer first, then fabricate the capacitor metal layers on the top of the shielding layer. This design separates the capacitor from the substrate of the semiconductor to reduce noise coupling.

These and other aspects, features, and advantages of the present invention will be apparent to those persons having ordinary skilled in the art to which the present invention relates from the foregoing description and the accompanying drawings.

DETAILED DESCRIPTION OF THE PREFERRED EMBODIMENT(S)

Figure 3:
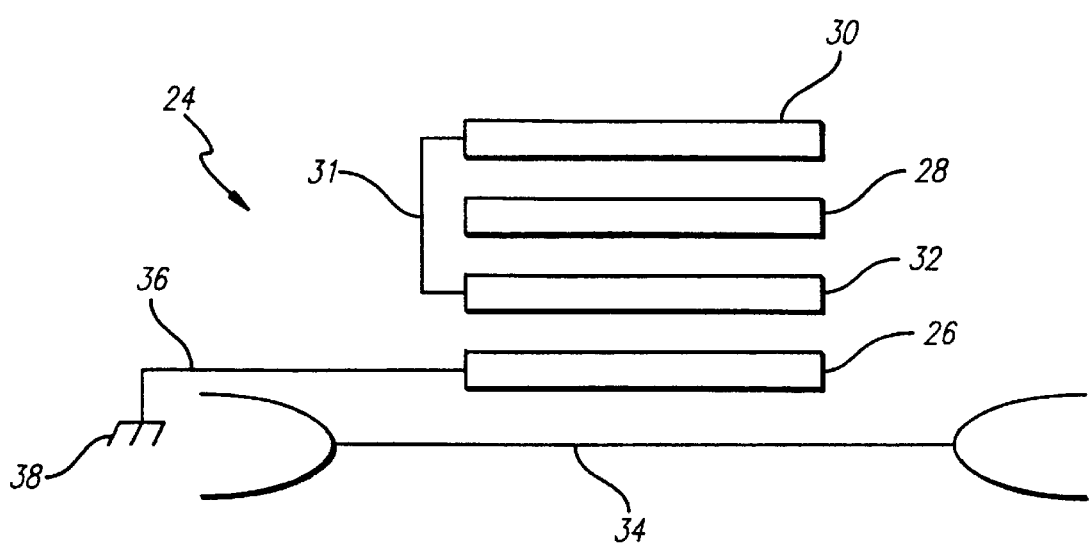
FIG. 3 is a block diagram of a capacitor fabricated in accordance to the present invention.

Referring now to FIG. 3, a capacitor 24 is illustrated. The capacitor 24 comprises the metal plates 28, 30, and 32. The top plate 28 forms one surface of the capacitor 24 and the bottom plates 30 and 32, positioned to sandwich the top plate 28, forms the other surface of the capacitor 24. The bottom plates 30 and 32 are connected 31, and their sandwich structure relative to the top plate 28 increases the surface area between the top plate 28 and the bottom plates 30 and 32. Also, the sandwich structure serves to reduce the noise coupling between the top plate 28 and the substrate 34.

Figure 1:
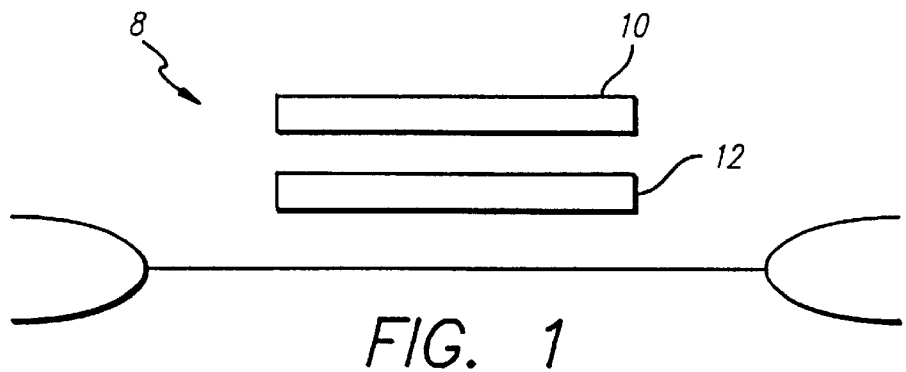
FIG. 1 is a block diagram of a conventional polysilicon-polysilicon capacitor typically used in analog semiconductor fabrication processes.
Figure 2:
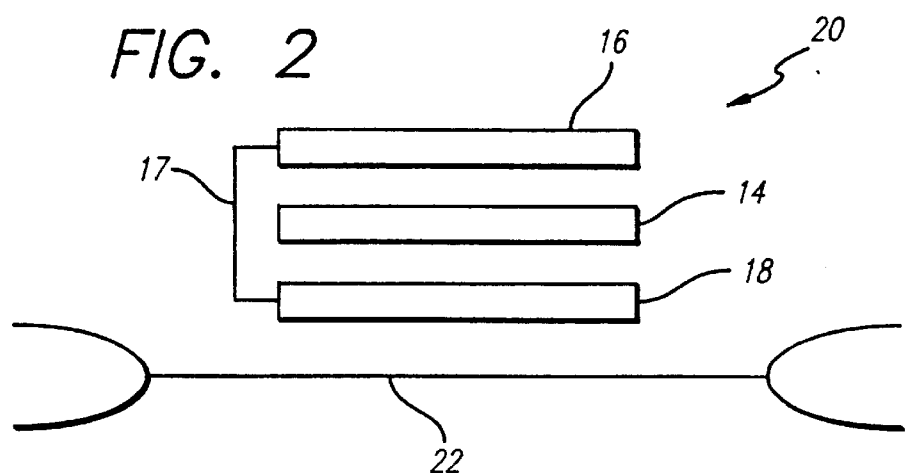
FIG. 2 is a block diagram of a conventional metal-metal capacitor typically used in digital semiconductor fabrication processes.

As discussed above, in analog processes, the top plate 10 of FIG. 1 and the bottom plate 12 of FIG. 1 are polysilicon. However, in digital processes, the plates are typically metal. In particular, a preferred embodiment of the present invention is to form the plates 28, 30, and 32 of the capacitor 24 of FIG. 3 using aluminum.

Continuing to refer to FIG. 3, the polysilicon layer 26, positioned between the metal layers 28, 30, and 32 and the substrate 34, isolates the metal layers 28, 30, and 32 from the substrate 34 to reduce the negative effects of noise for each other. Preferably, the polysilicon layer 26 is silicized to increase is conductivity. When connected 37 to the ground 38, the increased conductivity of silicized polysilicon layer is most effective in shielding the metal plates 28, 30, and 32 from the substrate 34.

One disadvantage of the sandwich structure as illustrated in FIG. 3 is a parasitic capacitance between the lower portion 32 of the bottom plate 30, 32 and the substrate 34. However, for switched-capacitor circuits, the only negative effect of the parasitic capacitance is a slight increase in power dissipation, and is of negligible concern for most applications.

To fabricate the shielded capacitor of the present invention in a digital CMOS process, the polysilicon layer 26 is first fabricated on the substrate 34. On top of the polysilicon layer, the metal layers 32, 28, 30, are fabricated in the order listed. Then, the layer 30 is connected to the layer 32.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

We claim:

1. A capacitor formed on a semiconductor, said capacitor comprising:
    a semiconductor substrate;
    a first plate of the capacitor fabricated above said substrate;
    a second plate of the capacitor facing said first plate; and
    a shielding layer disposed between said first plate and said substrate, said shielding layer overlapping substantially an entire area covered by said capacitor.

2. A capacitor according to claim 1 wherein said first plate and said second plate are metal.

3. A capacitor according to claim 1 wherein said first plate further comprises a first portion positioned above said second plate and a second portion, connected to said first portion, positioned below said second plate.

4. A capacitor according to claim 1 wherein said shielding layer is polysilicon.

5. A capacitor according to claim 4 wherein said shielding layer is silicized polysilicon.

6. A Complementary Metal Oxide Semiconductor (CMOS) semiconductor chip comprising:
    (a) a substrate;
    (b) a capacitor fabricated on said substrate, said capacitor comprising:
        (1) a first metal layer forming a bottom plate of said capacitor;
        (2) a second metal layer forming a top plate of said capacitor;
        (3) a third metal layer, connected to said first metal layer; and
    (c) a polysilicon layer disposed between said capacitor and said substrate as a shield against noise, said polysilicon layer overlapping substantially an entire area covered by said capacitor.

7. A CMOS chip according to claim 6 wherein said second metal layer is in between said first metal layer and said third metal layer.

8. A CMOS chip according to claim 6 wherein said top plate and said bottom plates are metal.

9. A CMOS chip according to claim 6 wherein said polysilicon layer is silicized polysilicon.

* * * * *